(12) United States Patent
Scarbrough et al.

(10) Patent No.: US 12,519,011 B2
(45) Date of Patent: Jan. 6, 2026

(54) STAIRCASE FORMATION IN A MEMORY ARRAY

(71) Applicant: Micron Technology, Inc., Boise, ID (US)

(72) Inventors: Alyssa N. Scarbrough, Boise, ID (US); Lifang Xu, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 629 days.

(21) Appl. No.: 17/896,919

(22) Filed: Aug. 26, 2022

(65) Prior Publication Data

US 2024/0071816 A1 Feb. 29, 2024

(51) Int. Cl.
*H01L 21/768* (2006.01)
*H01L 23/535* (2006.01)
*H10B 41/40* (2023.01)
*H10B 43/40* (2023.01)

(52) U.S. Cl.
CPC .. *H01L 21/76816* (2013.01); *H01L 21/76805* (2013.01); *H01L 21/76846* (2013.01); *H01L 21/76865* (2013.01); *H01L 21/76895* (2013.01); *H01L 23/535* (2013.01); *H10B 41/40* (2023.02); *H10B 43/40* (2023.02)

(58) Field of Classification Search
None
See application file for complete search history.

(56) References Cited

U.S. PATENT DOCUMENTS

2019/0326218 A1* 10/2019 Chen ............... H10B 41/10
2022/0262720 A1* 8/2022 Tachi ............... H01L 23/528

* cited by examiner

*Primary Examiner* — Alexander G Ghyka
(74) *Attorney, Agent, or Firm* — Holland & Hart LLP

(57) ABSTRACT

Methods, systems, and devices for staircase formation in a memory array are described. A liner composed of a first liner material may be deposited on a tread and a first portion of the liner may be doped. After doping the first portion of the liner, a second portion of the liner may be converted into a second liner material using a chemical process. After converting the second portion of the liner into the second liner material, the first portion of the liner material may be removed so that a subsequent removal process can expose a first sub-tread. After exposing the first sub-tread, the second portion of the liner may be removed so that a second sub-tread is exposed.

6 Claims, 14 Drawing Sheets

STAIRCASE FORMATION IN A MEMORY ARRAY

FIELD OF TECHNOLOGY

The following relates to one or more systems for memory, including staircase formation in a memory array.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
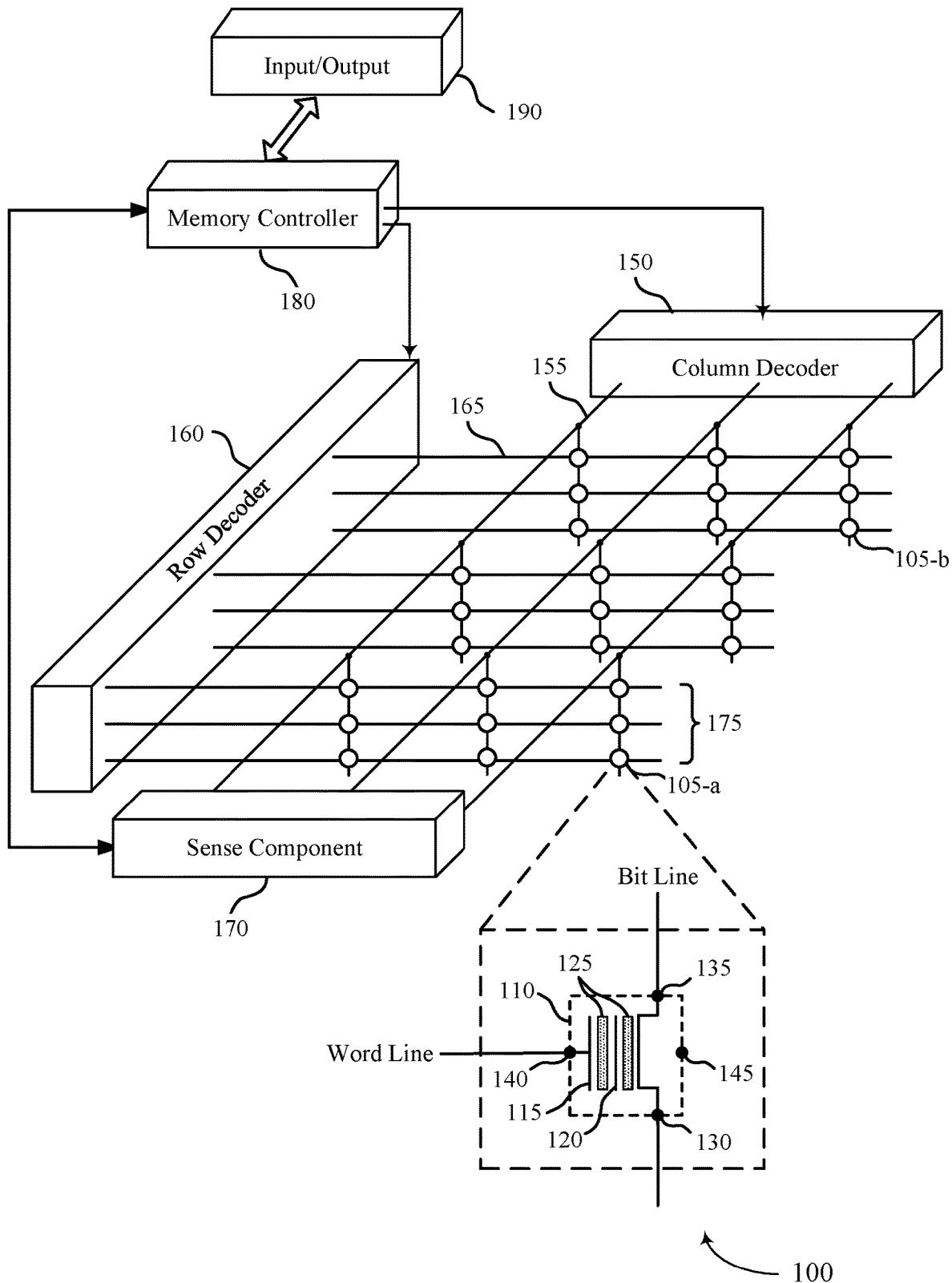
FIG. 1 illustrates an example of a system that supports staircase formation in a memory array in accordance with examples as disclosed herein.

In some memory systems, word line contacts may be used to couple the word lines of memory cells with supporting components. For example, a word line that is coupled with a memory cell may also be coupled with a word line contact that allows the memory system to apply electrical signals to the word line. If the word lines are stacked layers of metal material (e.g., tungsten) in the x-y plane, the word line contacts may be conductive pillars that couple with contact surfaces of the word lines and extend in the z-direction. To prevent shorts between word lines, the contact surfaces may form a staircase pattern where each landing surface is offset from the other and is referred to as a "tread" of the staircase. For example, if the treads (contact surfaces) are in the x-y plane, the staircase may extend widthwise in the x-direction, may extend lengthwise in the y-direction, and may extend height-wise in the z-direction.

As components of memory arrays scale and get smaller to include more memory cells and word lines, the quantity of word line contacts in a memory array may also increase. Instead of adding additional treads for the new word line contacts (which may increase the total area consumed by the word line contacts), it may be desirable to form lateral sub-treads on the treads of a staircase. For example, it may be desirable to form two lateral sub-treads on the treads of the staircase, permitting two times (2×) more word line contacts per unit area relative to other designs. But the manufacturing process used to form the treads may be inadequate to form the sub-treads in the sizes used to increase the quantity of word line contacts and reduce the area used by each word line contact. A lateral sub-tread may also be referred to herein as a contact surface, lateral fold, or other suitable terminology.

The techniques described herein allow for formation of two or more lateral sub-treads (contact surfaces) in a staircase architecture for word line contacts, thus reducing the area consumed by the word line contacts. A staircase with lateral sub-treads (contact surfaces) may also be referred to herein as a folded staircase.

To form multiple lateral sub-treads (contact surfaces), a liner composed of a first liner material (e.g., polysilicon) may be deposited on a tread and a first portion of the liner may be doped (e.g., with boron). After doping the first portion of the liner, a second portion of the liner (which may overlay an area of the tread that will become the second sub-tread) may be converted into a second liner material (e.g., tungsten) using a chemical process. The second liner material may more robustly withstand a removal process (e.g., dry etching) relative to the first liner material. After converting the second portion of the liner into the second liner material, the first portion of the liner material may be removed so that a subsequent removal process (e.g., dry etching) can expose the first sub-tread. After exposing the first sub-tread, the second portion of the liner may be removed (e.g., via wet etching) so that the second sub-tread is exposed.

Thus, two lateral sub-treads (contact surfaces) may be formed on a tread in a staircase architecture for word line contacts. Compared to other techniques, conversion of the first liner material to the second liner material may allow for a thinner liner (which may be referred to as an etch-stop layer) and may negate the use for additional process steps such as gap filling, among other advantages.

Features of the disclosure are initially described in the context of systems, devices, and circuits with reference to FIG. 1. Features of the disclosure are described in the context of a material structure with reference to FIGS. 2A through 2K. These and other features of the disclosure are further illustrated by and described in the context of flowcharts that relate to staircase formation in a memory array with reference to FIGS. 3 through 4.

FIG. 1 illustrates an example of a memory device 100 that supports staircase formation in a memory array in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

The word lines 165 may be coupled with various components (e.g., word line drivers 238) via word line contacts. For example, if the word lines 165 are stacked metal layers in the x-y plane, word line contacts that extend in the z-direction may couple the word lines 165 to word line drivers 238. The contact surfaces (treads) of the word lines 165 may form a rising staircase (e.g., with each tread higher in the z-direction than the previous tread). To reduce the area consumed by the word line contacts, lateral sub-treads (also referred to as contact surfaces) may be formed in the treads according to the techniques described herein. Specifically, the lateral contact surfaces may be formed by using a liner material and converting a portion of the liner material into a different material.

FIGS. 2A through 2K illustrate examples of a material structure 200 at different stages of a process that forms multiple lateral contact surfaces in a word line staircase. FIGS. 2A through 2K show a cross-section of the material structure 200. Aspects of the material structure 200 may be described with reference to an x-direction, a y-direction, and a z-direction of the illustrated coordinate system. Although described with reference to two contact surfaces, the techniques described herein can be extended to any quantity of contact surfaces.

Figure 2A:
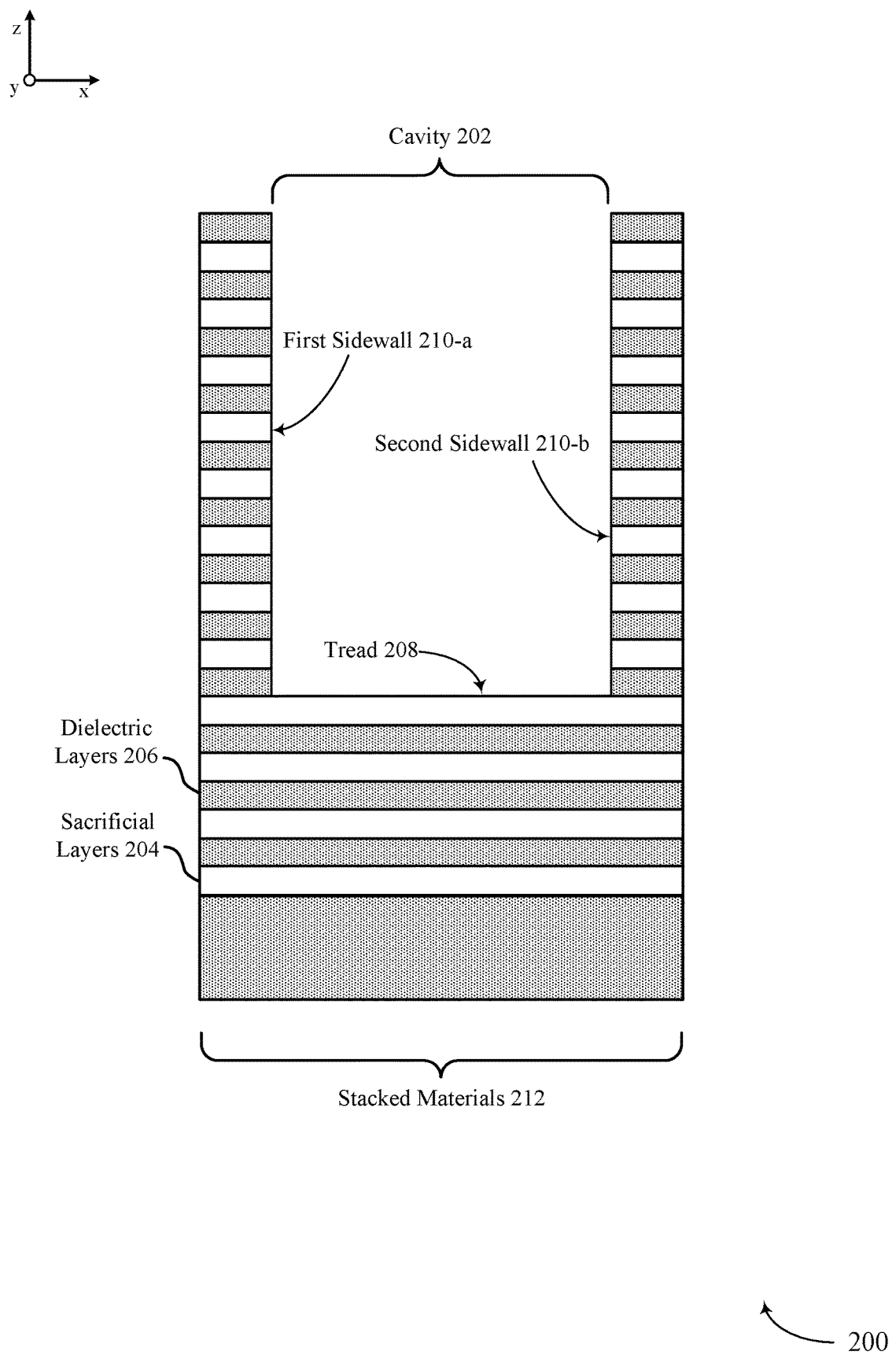
FIGS. 2A through 2K illustrate an example of a material structure that supports staircase formation in a memory array in accordance with examples as disclosed herein.

FIG. 2A illustrates an example of a material structure 200 after a cavity 202 is formed in a set of stacked materials 212. The stacked materials 212 may include alternating materials or layers. For examples, the stacked materials 212 may include a dielectric material (e.g., oxide) formed as dielectric layers 206 and may include a sacrificial material (e.g., nitride) formed as sacrificial layers 204. In some examples, the stacked materials 212 may be formed by depositing the dielectric material and the sacrificial material layer-by-layer. The cavity 202 may be formed by removing sections of the dielectric layers 206 and the sacrificial layers 204. A dry-etch process may be used to form the cavity 202.

The bottom or floor of the cavity 202 may be in the x-y plane and may form a tread 208 of a word line staircase as described herein. For example, the staircase may extend lengthwise in the y-direction (e.g., into the page) and may extend height-wise in the z-direction.

The cavity 202 may be defined by a first sidewall 210-a of the stacked materials 212 and a second sidewall 210-b of the stacked materials 212, each of which may be perpendicular to the tread 208. The sacrificial material may be a placeholder material that is replaced with a metal material (e.g., that makes up the word lines) after the contact surfaces have been formed on the tread 208. A sacrificial material may also be referred to as a placeholder material, a temporary material, or other suitable terminology.

Figure 2B:
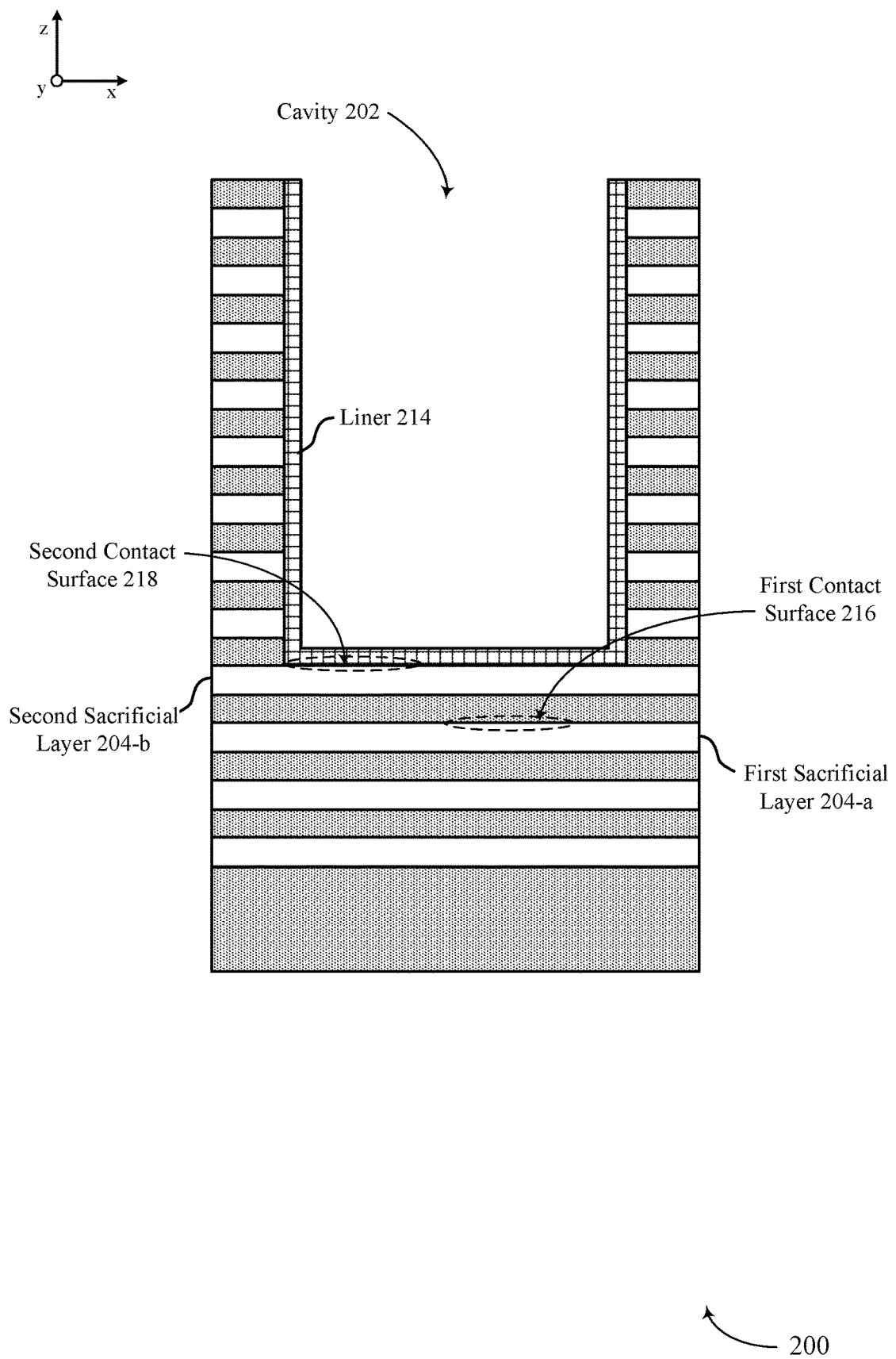

FIG. 2B illustrates an example of the material structure 200 after a liner 214 is deposited in the cavity 202. In some examples, the liner 214 may comprise a first liner material, such as a polysilicon material. The liner 214 may overlay the tread 208, the first sidewall 210-a, and the second sidewall 210-b. Thus, the liner 214 may overlay the first sacrificial layer 204-a. The liner 214 may allow for formation of a protective barrier (e.g., etch stop) that helps protect the second contact surface 218 of the second sacrificial layer 204-b during a subsequent removal processes that exposes the first contact surface 216 of the first sacrificial layer 204-a.

Figure 2C:
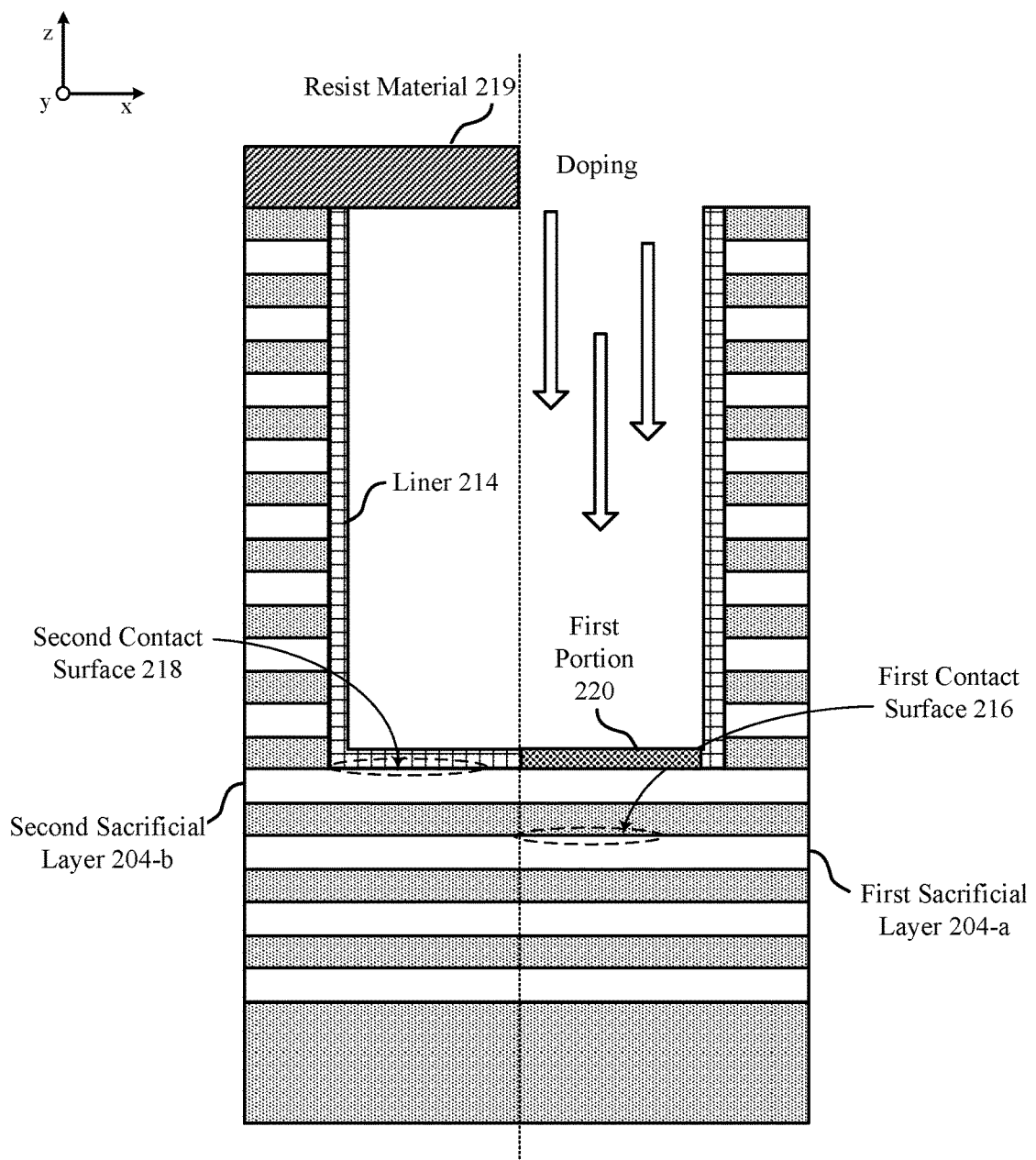

FIG. 2C illustrates an example of the material structure 200 after selectively doping a portion of the liner 214 to form a doped portion (e.g., first portion 220). In some examples, doping the portion of the liner 214 may include doping the liner 214 with boron. In some examples, a resist material 219 may shield some of the liner 214 from the doping. Thus, use of a resist material 219 may allow for the selective doping where a first portion 220 of the liner 214 is doped and the rest of the liner 214 (e.g., including the second portion 222) remains undoped. The first portion 220 may be above the first contact surface 216 of the first sacrificial layer 204-a. The second portion 222 may overlay the second contact surface 218 of the second sacrificial layer 204-b. Doping the first portion 220 of the liner 214 may change the properties of the first portion 220 so that the first portion 220 is resistant to a subsequent chemical conversion process that is used to convert the material of the second portion 222.

Figure 2D:
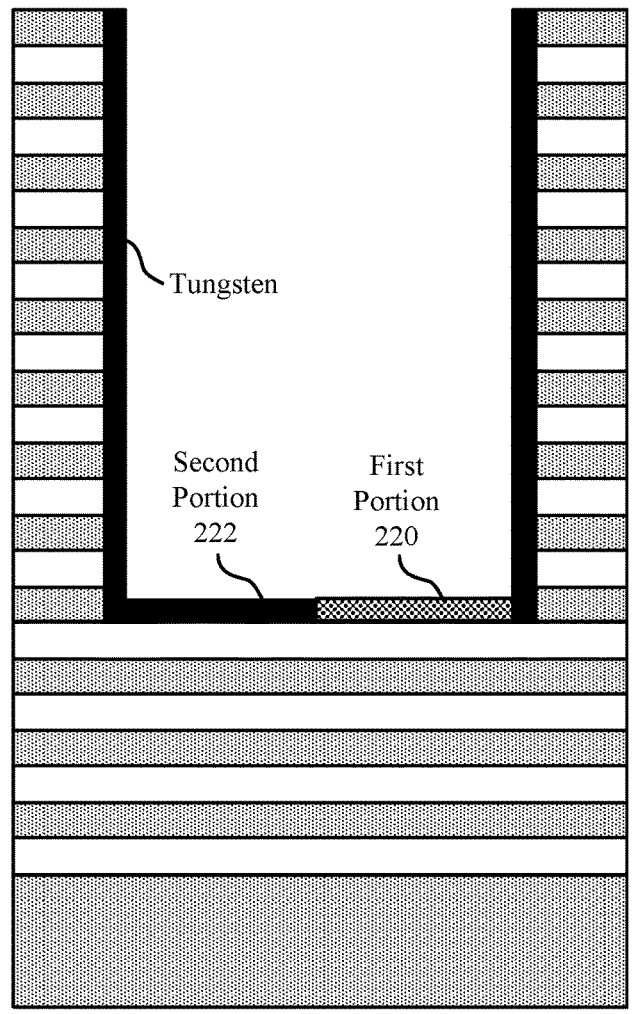

FIG. 2D illustrates an example of the material structure 200 after converting the second portion 222 of the liner 214 from a first material to a second material. For example, a chemical process may be used to convert the second portion 222 from polysilicon to tungsten. Compared to the polysilicon, the tungsten may provide a more robust etch-stop than the polysilicon (which may be beneficial during later etching steps), which in turn may allow the tungsten to be thinner (which may provide cost-savings). Due to the doping, the first portion 220 of the liner 214 may resist the chemical process used to convert second portion 222 and thus may remain as doped polysilicon. Relative to other techniques, conversion of the first liner material to the second liner material may allow for use of a thinner liner 214 (which may reduce manufacturing costs) and may negate the use for additional process steps such as gap filling, among other advantages.

Figure 2E:
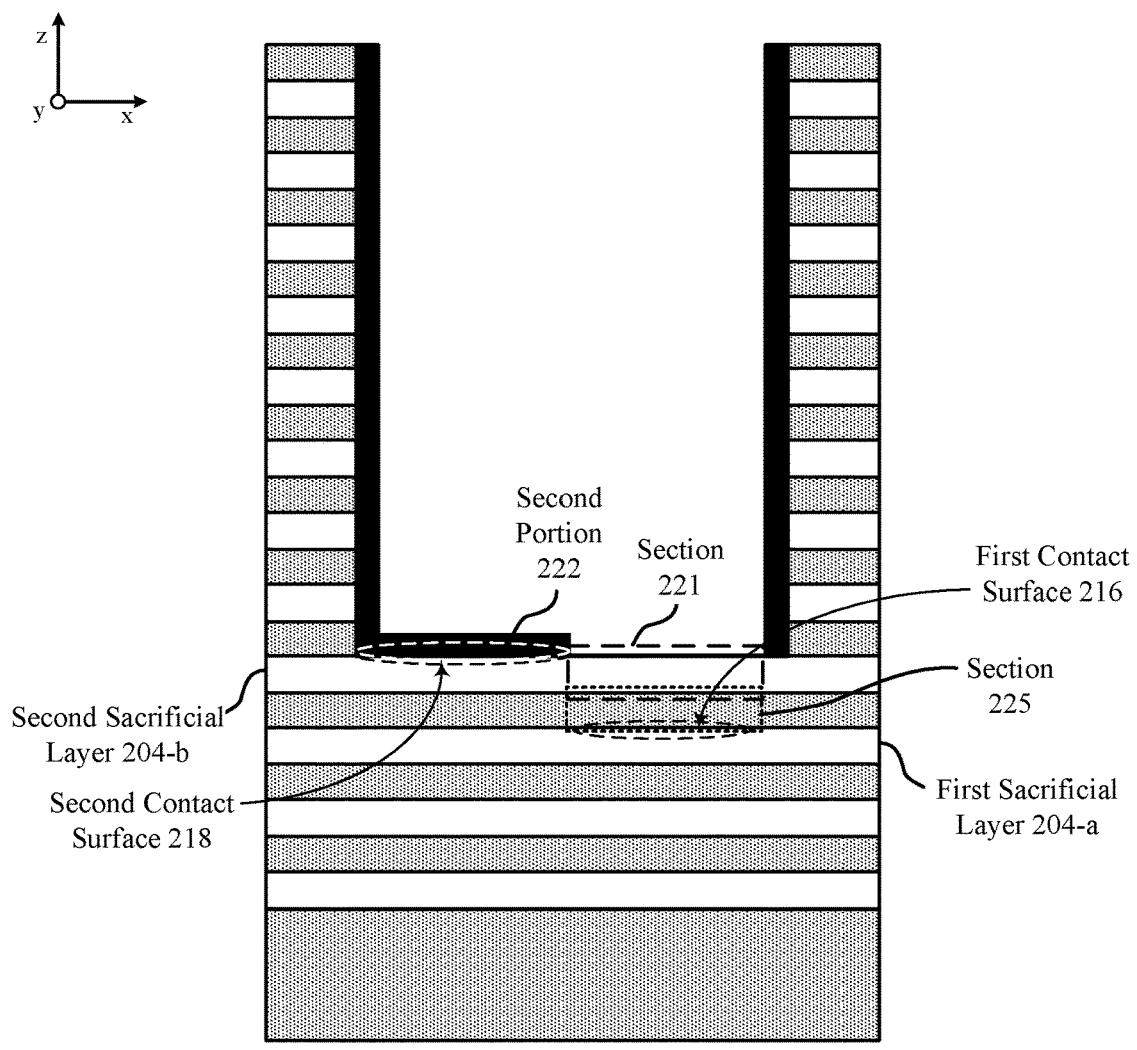
Figure 2E:
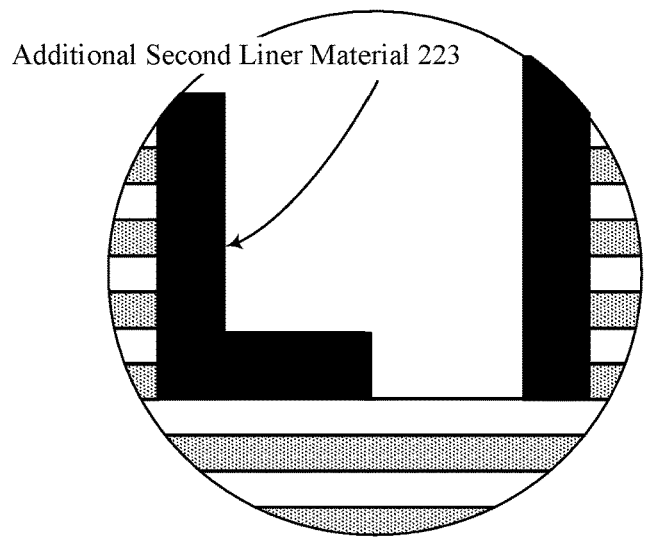

FIG. 2E illustrates an example of the material structure 200 after removing the first portion 220 of the liner 214 and leaving the second portion 222. In some examples, the removal process (to which the second portion 222 is impervious) may use Tetramethylammonium Hydroxide (TMAH) to remove the first portion 220 from the material structure 200. Removing the first portion 220 may expose the second sacrificial layer 204-b for a subsequent removal process that is used to expose the first contact surface 216. Retaining the second portion 222 may protect the second contact surface 218 from the removal process used to expose the first contact surface 216.

In some examples (e.g., as shown in the bottom figure), additional second liner material 223 (e.g., additional tungsten) may be deposited on the second portion 222 to increase the thickness of the second portion 222 (and thus improve the resiliency of the second portion 222 with respect to one or more subsequent removal processes).

Figure 2F:
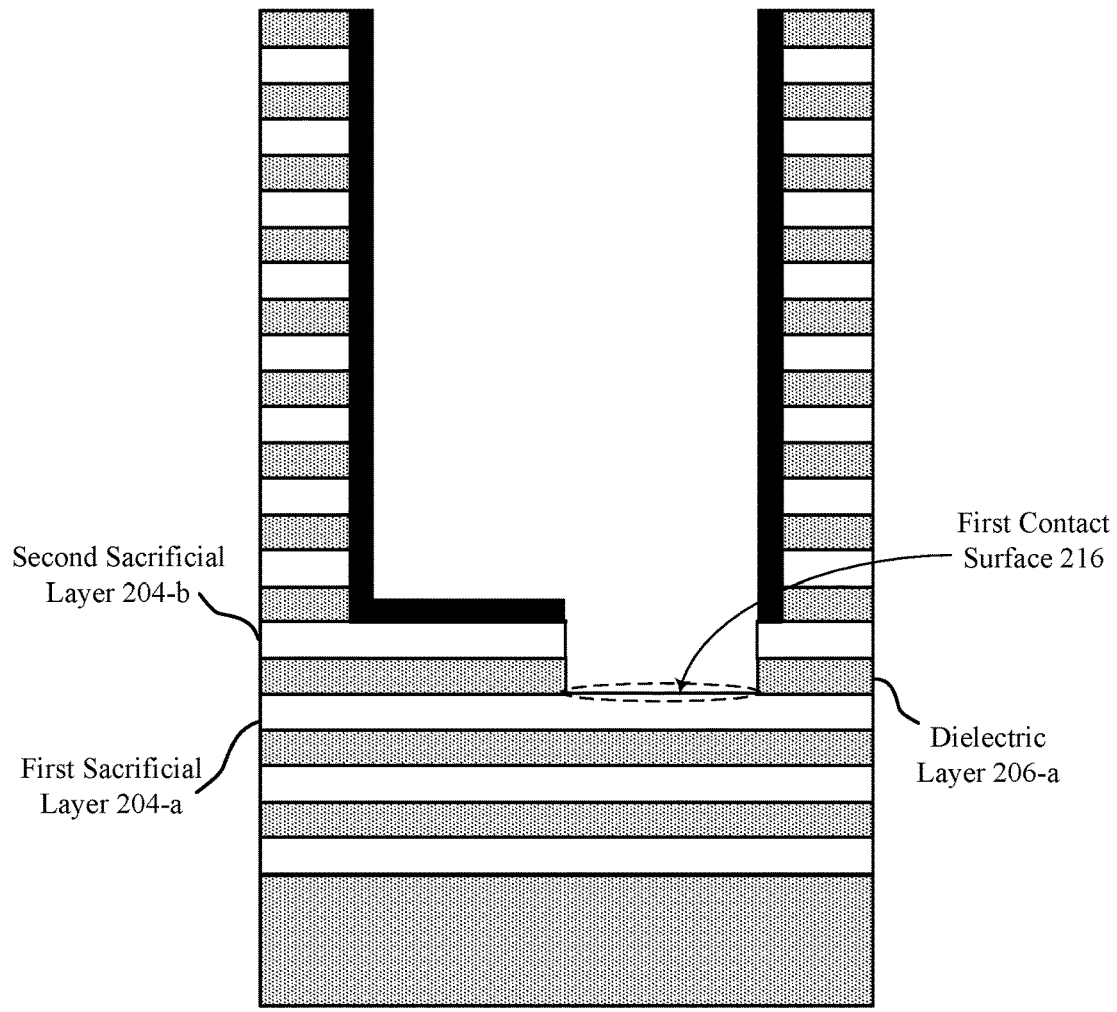

FIG. 2F illustrates an example of the material structure 200 after removing a section (e.g., section 221) of the second sacrificial layer 204-b and a section (e.g., section 225) of the dielectric layer 206-a that is above (e.g., in the z-direction) the first sacrificial layer 204-a and below (e.g., in the z-direction) the second sacrificial layer 204-b. In some examples, a wet-etching process may be used to remove the sections of second sacrificial layer 204-b and the dielectric layer 206-a. Removing the sections of second sacrificial layer 204-b and the dielectric layer 206-a may expose the first contact surface 216 of the first sacrificial layer 204-a.

Figure 2G:
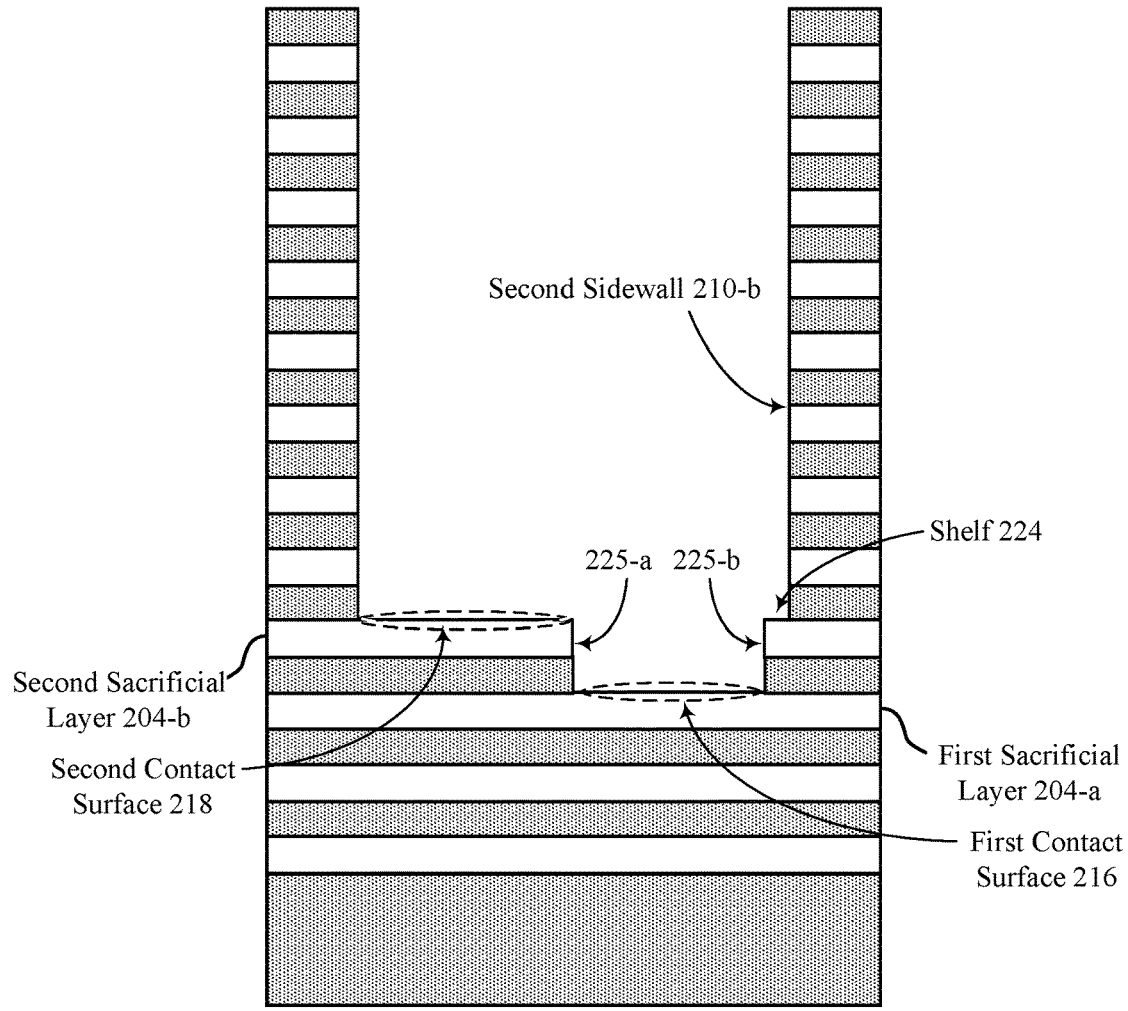

FIG. 2G illustrates an example of the material structure 200 after removing the second portion 222 of the liner 214. In some examples, a wet-etching process may be used to remove the second portion 222 of the liner 214. The wet-etching process may use a sulfuric peroxide mixture (SPM), ammonia peroxide mixture (APM), or other suitable chemical solutions. Removing the second portion 222 may expose the second contact surface 218 of the second sacrificial layer 204-b. Thus, the material structure 200 may include multiple lateral sub-treads (e.g., first contact surface 216 and second contact surface 218). Removing the second portion 222 may expose a shelf 224 of the second sidewall 210-b. Removing the second portion 222 may form a first sidewall 225-a extending from the first contact surface 216 to the second contact surface 218 and a second sidewall 225-b extending from the first contact surface 216 to the shelf 224. The size of the shelf 224 (e.g., from the second sidewall 210-b to the second sidewall 225-b) may be based on a thickness of the second portion 222.

Figure 2H:
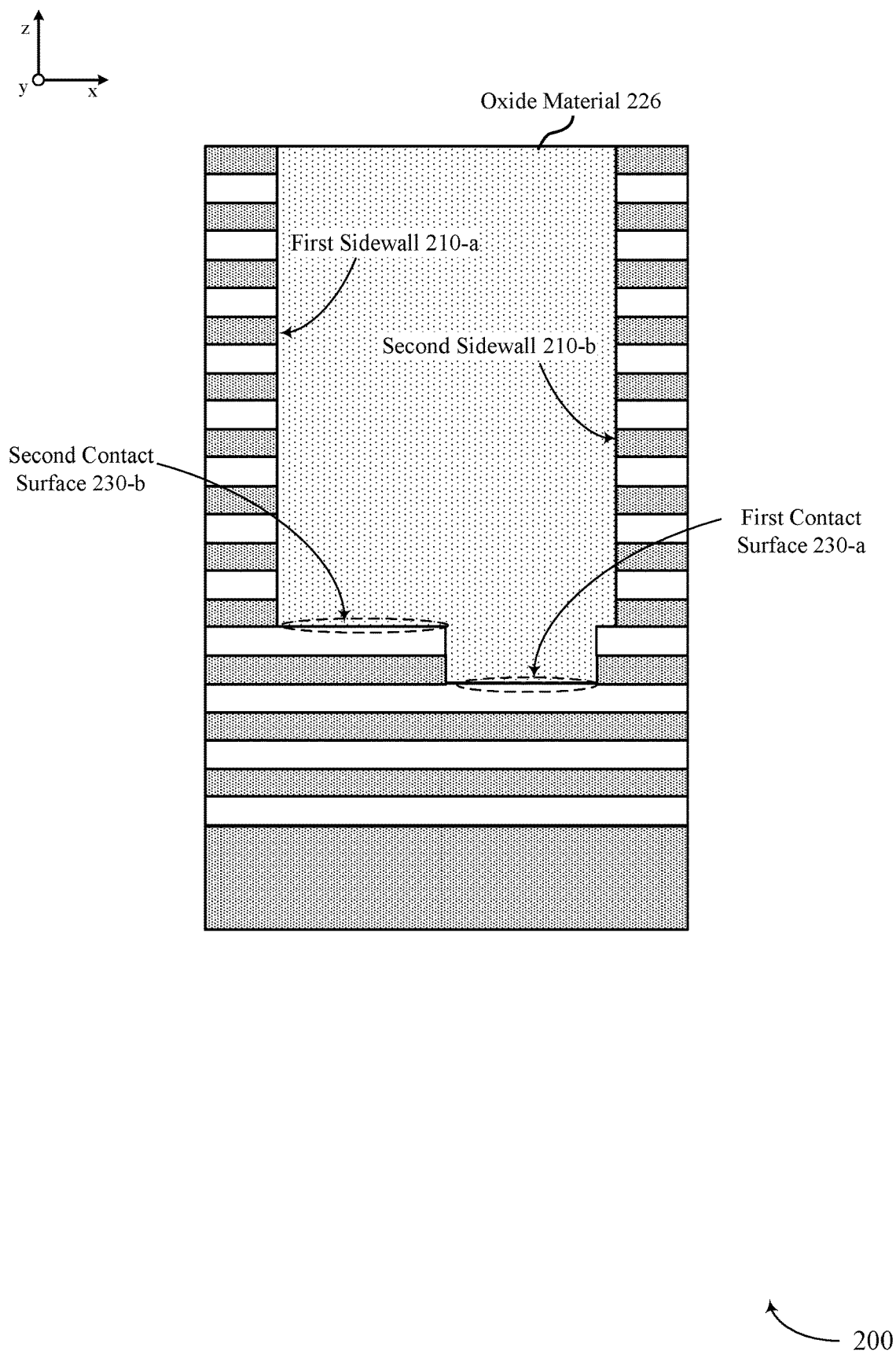

FIG. 2H illustrates an example of the material structure 200 after depositing a non-conductive material, such as the oxide material 226, within the cavity 202. The oxide material 226 may be deposited so that the oxide material 226 at least partially fills the cavity 202 and overlays the first sidewall 210-a, the second sidewall 210-b, the first contact surface 216, and the second contact surface 218. Depositing the oxide material 226 may allow for conductive pillars (e.g., word line contacts) to be formed within the material structure 200, among other purposes.

Figure 2I:
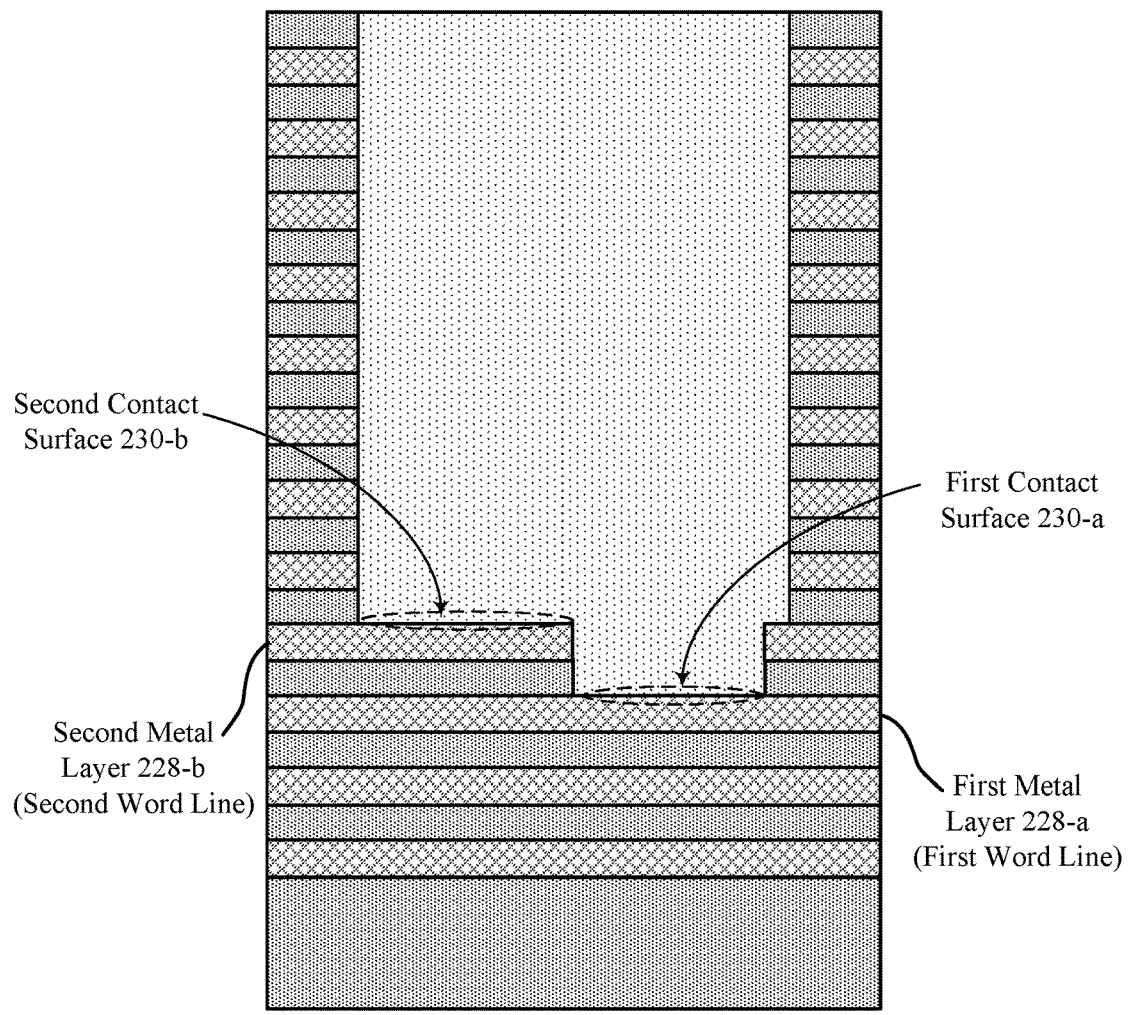

FIG. 2I illustrates an example of the material structure 200 after replacing the sacrificial material with a metal material. For example, the first sacrificial layer 204-a may be replaced by a first metal layer 228-a that forms a first word line coupled with a first memory cell. Similarly, the second sacrificial layer 204-b may be replaced by a second metal layer 228-b that forms a second word line coupled with a second memory cell. Thus, the material structure 200 may include a first contact surface 230-a of the first metal layer 228-a and a second contact surface 230-b of the second metal layer 228-b. In some examples, the replacement process may be referred to as a replacement gate (RG) process.

Figure 2J:
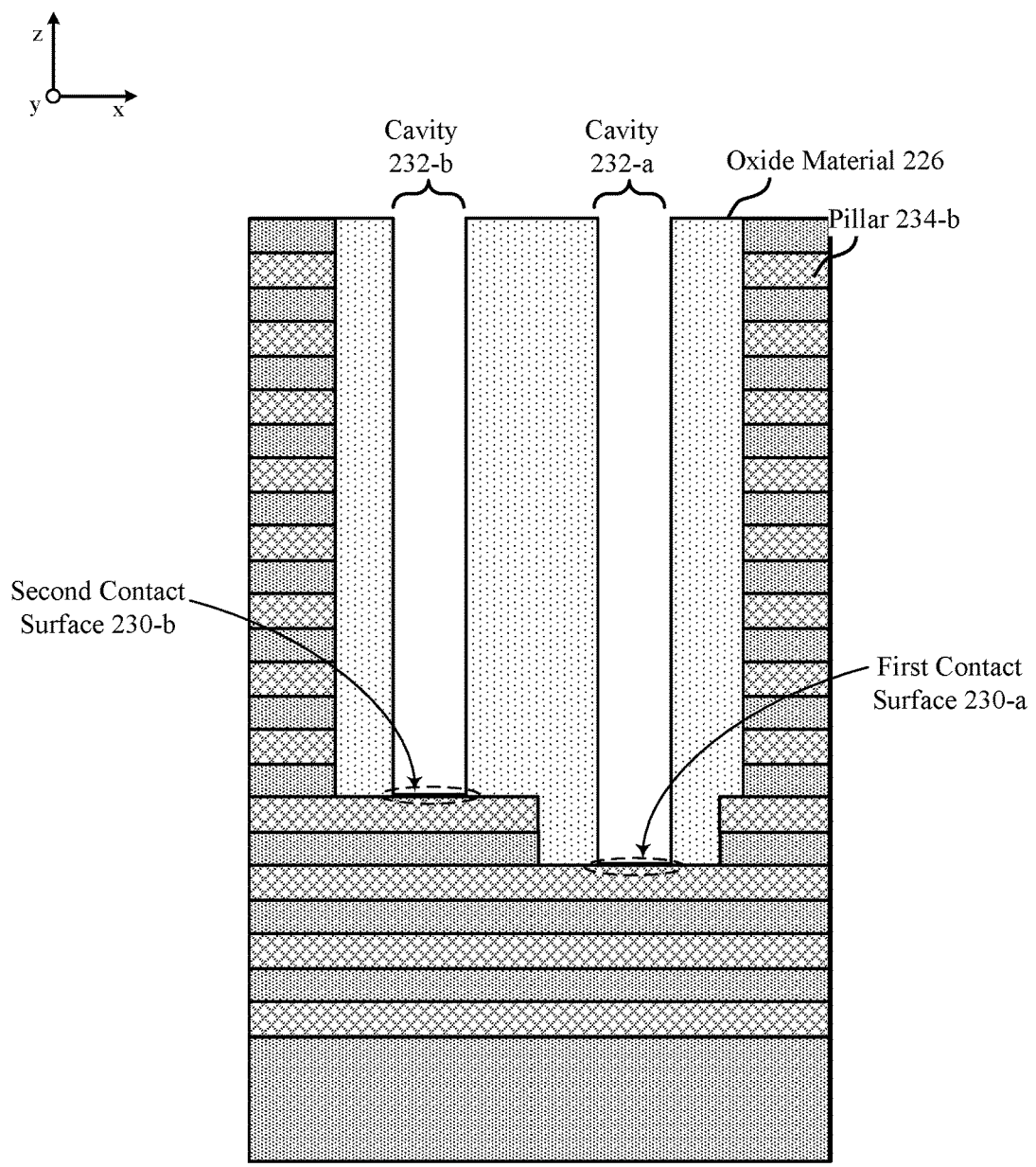

FIG. 2J illustrates an example of the material structure 200 after forming elongated cavities, such as cavity 232-a and cavity 232-b, in the material structure 200. In some examples, a dry-etching process may be used to form the cavities. The cavities 232 may be formed through the oxide material 226. The metal layers 228 may serve as etch stops so that the cavities stop at the metal layers 228. So, forming the cavities 232 may expose the first contact surface 230-a and the second contact surface 230-b.

Figure 2K:
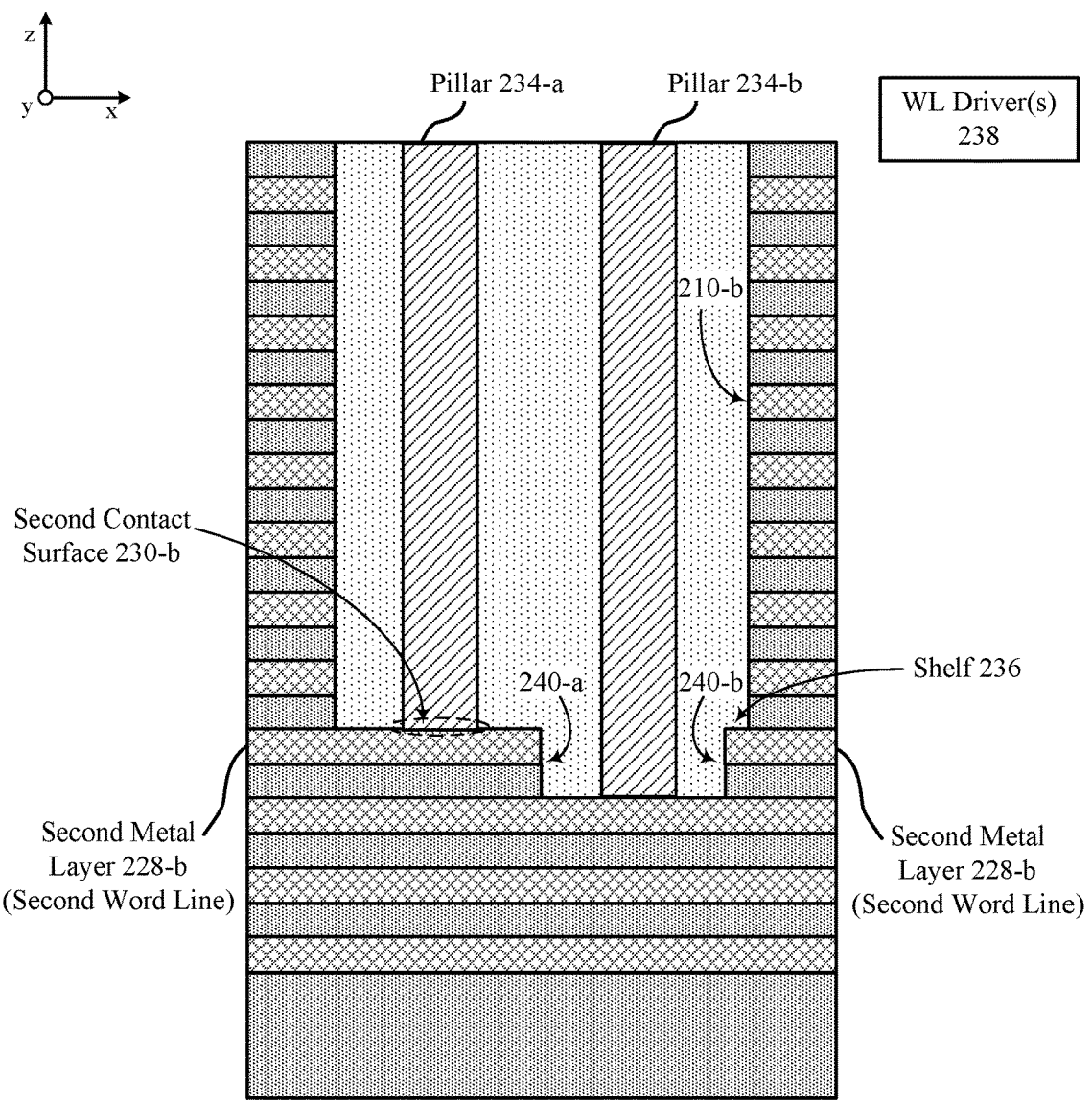
Figure 2K:
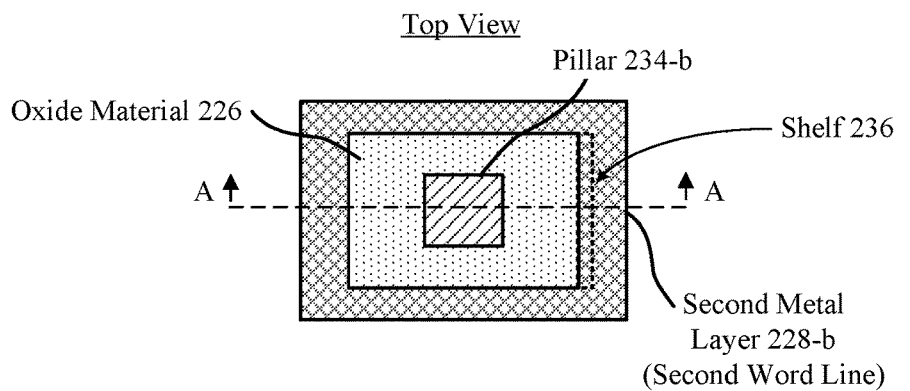

FIG. 2K illustrates an example of the material structure 200 after forming conductive (e.g., metal) pillars, such as pillar 234-a and pillar 234-b, within the elongated cavities 232. For example, pillar 234-a may be formed within cavity 232-a, and pillar 234-b may be formed within the cavity 232-b.

The material structure 200 may include a shelf 236, similar to the shelf 224. The shelf 236 may include at least a portion of the second metal layer 228-b, which may extend around the front and/or back of the pillar 234-b. For instance, as can be seen from the planar top view of the material structure 200, the second metal layer 228-*b* may surround the oxide material 226 and the pillar 234-*b*. So, the shelf 236 may extend from the second sidewall at the same height (e.g., in the z-direction) as the second contact surface 230-*b*. The cross-sectional view in the top figure is relative to the line A-A of the top view.

The width of the shelf 236 in the x-direction may be equal to the thickness (e.g., in the x-direction) of the liner 214. The height of the shelf 236 (in the z-direction and relative to the first contact surface 230-*a* may be equal to the sum of A) the height of the second metal layer 228-*b* and B) the dielectric layer below the second metal layer 228-*b*. As can be seen in FIG. 2K, the shelf 236 may form a horizontal surface that is parallel with the contact surfaces and that is perpendicular to the sidewalls. The shelf 236 may be separated from the conductive pillar 234-*b* by the oxide material 226.

The pillar 234-*b* may be between a first sidewall 240-*a* extending from the first contact surface 230-*a* to the second contact surface 230-*b* and a second sidewall 240-*b* extending from the first contact surface 230-*a* to the shelf 236. The size of the shelf 236 (e.g., from the second sidewall 210-*b* to the second sidewall 240-*b*) may be based on a thickness of the liner 214.

Thus, the material structure 200 may include two word line contact surfaces 230 (lateral sub-treads), which may reduce the area consumed by the word line contacts (pillars 234).

Figure 3:
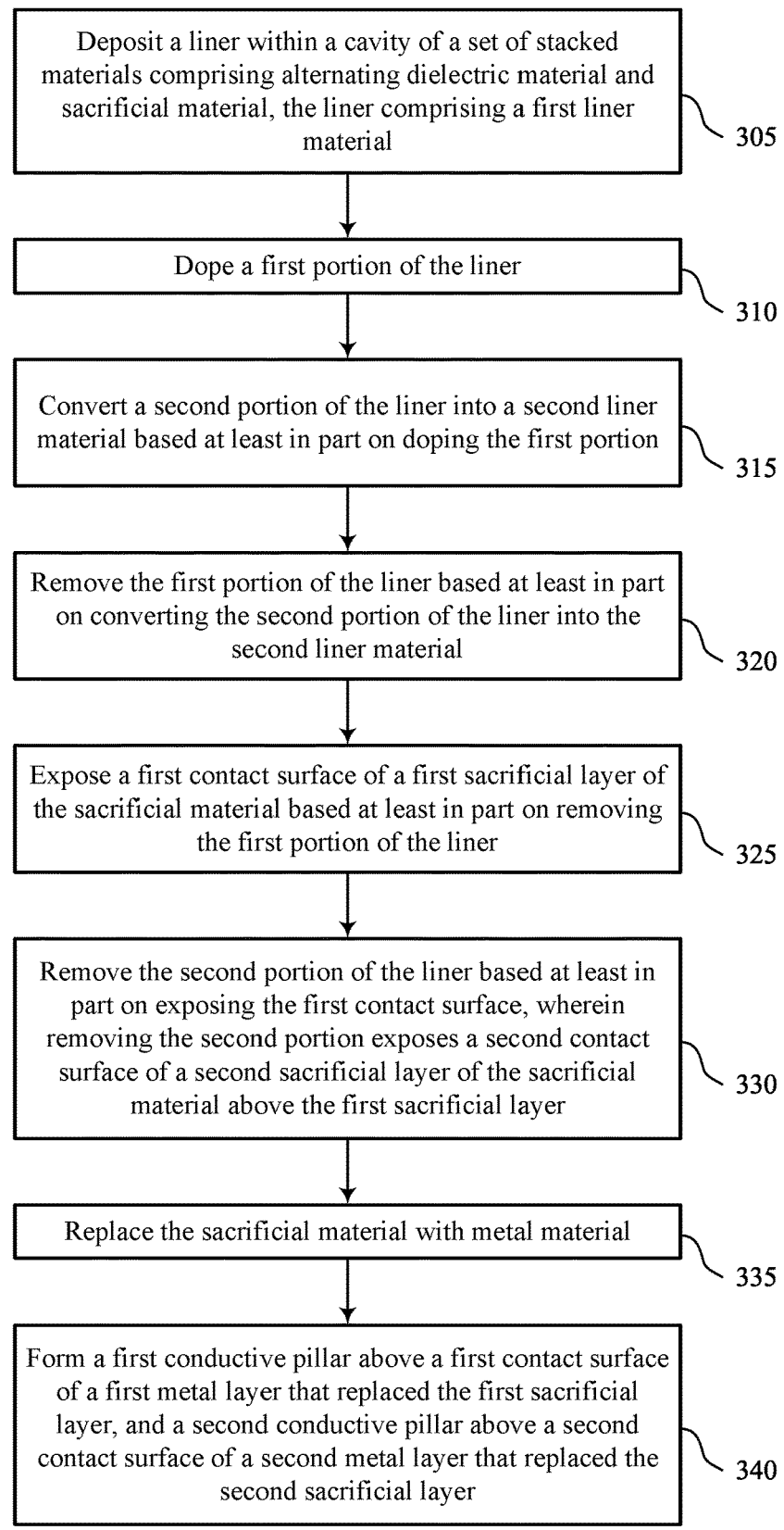
FIGS. 3 and 4 show flowcharts illustrating a method or methods that support staircase formation in a memory array in accordance with examples as disclosed herein.

FIG. 3 shows a flowchart illustrating a method 300 that supports staircase formation in a memory array in accordance with examples as disclosed herein. The operations of method 300 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 305, the method may include depositing a liner within a cavity of a set of stacked materials including alternating dielectric material and sacrificial material, the liner including a first liner material. The operations of 305 may be performed in accordance with examples as disclosed herein.

At 310, the method may include doping a first portion of the liner. The operations of 310 may be performed in accordance with examples as disclosed herein.

At 315, the method may include converting a second portion of the liner into a second liner material based at least in part on doping the first portion. The operations of 315 may be performed in accordance with examples as disclosed herein.

At 320, the method may include removing the first portion of the liner based at least in part on converting the second portion of the liner into the second liner material. The operations of 320 may be performed in accordance with examples as disclosed herein.

At 325, the method may include exposing a first contact surface of a first sacrificial layer of the sacrificial material based at least in part on removing the first portion of the liner. The operations of 325 may be performed in accordance with examples as disclosed herein.

At 330, the method may include removing the second portion of the liner based at least in part on exposing the first contact surface, where removing the second portion exposes a second contact surface of a second sacrificial layer of the sacrificial material above the first sacrificial layer. The operations of 330 may be performed in accordance with examples as disclosed herein.

At 335, the method may include replacing the sacrificial material with metal material. The operations of 335 may be performed in accordance with examples as disclosed herein.

At 340, the method may include forming a first conductive pillar above a first contact surface of a first metal layer that replaced the first sacrificial layer, and a second conductive pillar above a second contact surface of a second metal layer that replaced the second sacrificial layer. The operations of 340 may be performed in accordance with examples as disclosed herein.

In some examples, an apparatus (e.g., a manufacturing system) as described herein may perform a method or methods, such as the method 300. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for depositing a liner within a cavity of a set of stacked materials including alternating dielectric material and sacrificial material, the liner including a first liner material; doping a first portion of the liner; converting a second portion of the liner into a second liner material based at least in part on doping the first portion; removing the first portion of the liner based at least in part on converting the second portion of the liner into the second liner material; exposing a first contact surface of a first sacrificial layer of the sacrificial material based at least in part on removing the first portion of the liner; removing the second portion of the liner based at least in part on exposing the first contact surface, where removing the second portion exposes a second contact surface of a second sacrificial layer of the sacrificial material above the first sacrificial layer; replacing the sacrificial material with metal material; and forming a first conductive pillar above a first contact surface of a first metal layer that replaced the first sacrificial layer, and a second conductive pillar above a second contact surface of a second metal layer that replaced the second sacrificial layer.

Aspect 2: The method or apparatus of aspect 1, further including operations, features, circuitry, logic, means, or instructions, or any combination thereof for forming the cavity in the set of stacked materials before depositing the liner.

Aspect 3: The method or apparatus of any of aspects 1 through 2, where the first liner material includes polysilicon and the first portion of the first liner material is doped with boron.

Aspect 4: The method or apparatus of aspect 3, where the second liner material includes tungsten.

Aspect 5: The method or apparatus of any of aspects 1 through 4, further including operations, features, circuitry, logic, means, or instructions, or any combination thereof for depositing, after removing the first portion of the liner, additional second liner material over the second liner material to increase a thickness of the second liner material.

Aspect 6: The method or apparatus of any of aspects 1 through 5, further including operations, features, circuitry, logic, means, or instructions, or any combination thereof for removing a section of the second sacrificial layer based at least in part on removing the first portion of the liner, where the first contact surface is exposed based at least in part on removing the section of the second sacrificial layer.

Aspect 7: The method or apparatus of any of aspects 1 through 6, further including operations, features, circuitry, logic, means, or instructions, or any combination thereof for removing, based at least in part on removing the first portion of the liner, a section of a dielectric layer that is below the second sacrificial layer and above the first sacrificial layer, where the first contact surface is exposed based at least in part on removing the section of the second sacrificial layer.

Aspect 8: The method or apparatus of any of aspects 1 through 7, where the set of stacked materials includes a sidewall and, where removing the second portion of the liner exposes a shelf of the sidewall.

Aspect 9: The method or apparatus of any of aspects 1 through 8, further including operations, features, circuitry, logic, means, or instructions, or any combination thereof for depositing oxide material within the cavity based at least in part on exposing the second contact surface of the second sacrificial layer, where the sacrificial material is replaced with the metal material after depositing the oxide material.

Aspect 10: The method or apparatus of aspect 9, further including operations, features, circuitry, logic, means, or instructions, or any combination thereof for forming elongated cavities through the oxide material, where the first conductive pillar and the second conductive pillar are each formed within a respective elongated cavity of the elongated cavities.

Figure 4:
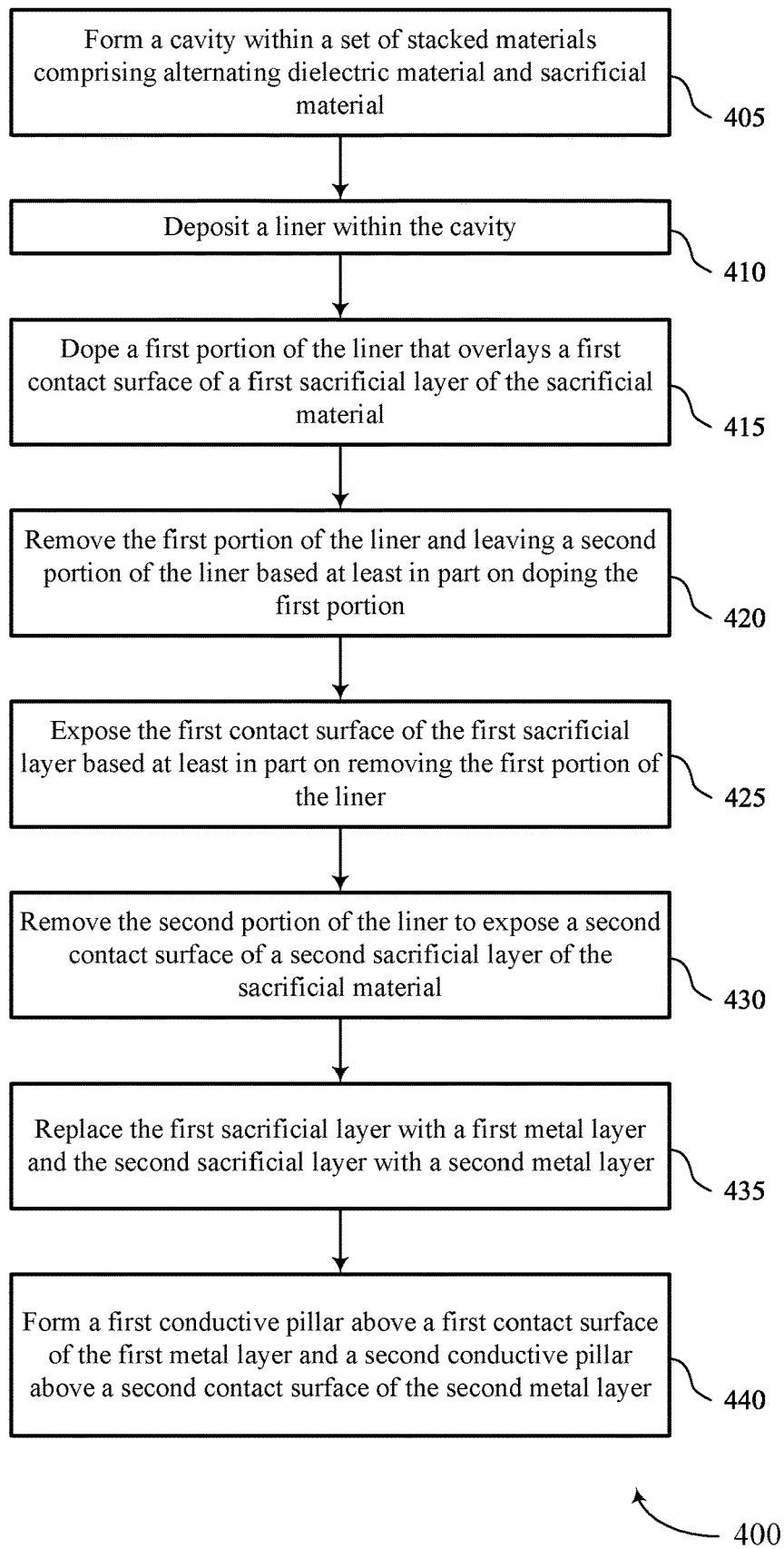

FIG. 4 shows a flowchart illustrating a method 400 that supports staircase formation in a memory array in accordance with examples as disclosed herein. The operations of method 400 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 405, the method may include forming a cavity within a set of stacked materials including alternating dielectric material and sacrificial material. The operations of 405 may be performed in accordance with examples as disclosed herein.

At 410, the method may include depositing a liner within the cavity. The operations of 410 may be performed in accordance with examples as disclosed herein.

At 415, the method may include doping a first portion of the liner that overlays a first contact surface of a first sacrificial layer of the sacrificial material. The operations of 415 may be performed in accordance with examples as disclosed herein.

At 420, the method may include removing the first portion of the liner and leaving a second portion of the liner based at least in part on doping the first portion. The operations of 420 may be performed in accordance with examples as disclosed herein.

At 425, the method may include exposing the first contact surface of the first sacrificial layer based at least in part on removing the first portion of the liner. The operations of 425 may be performed in accordance with examples as disclosed herein.

At 430, the method may include removing the second portion of the liner to expose a second contact surface of a second sacrificial layer of the sacrificial material. The operations of 430 may be performed in accordance with examples as disclosed herein.

At 435, the method may include replacing the first sacrificial layer with a first metal layer and the second sacrificial layer with a second metal layer. The operations of 435 may be performed in accordance with examples as disclosed herein.

At 440, the method may include forming a first conductive pillar above a first contact surface of the first metal layer and a second conductive pillar above a second contact surface of the second metal layer. The operations of 440 may be performed in accordance with examples as disclosed herein.

In some examples, an apparatus (e.g., a manufacturing system) as described herein may perform a method or methods, such as the method 400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 11: A method or apparatus including operations, features, circuitry, logic, means, or instructions, or any combination thereof for forming a cavity within a set of stacked materials including alternating dielectric material and sacrificial material; depositing a liner within the cavity; doping a first portion of the liner that overlays a first contact surface of a first sacrificial layer of the sacrificial material; removing the first portion of the liner and leaving a second portion of the liner based at least in part on doping the first portion; exposing the first contact surface of the first sacrificial layer based at least in part on removing the first portion of the liner; removing the second portion of the liner to expose a second contact surface of a second sacrificial layer of the sacrificial material; replacing the first sacrificial layer with a first metal layer and the second sacrificial layer with a second metal layer; and forming a first conductive pillar above a first contact surface of the first metal layer and a second conductive pillar above a second contact surface of the second metal layer.

Aspect 12: The method or apparatus of aspect 11, further including operations, features, circuitry, logic, means, or instructions, or any combination thereof for converting the second portion of the liner from a first material to a second material based at least in part on doping the first portion.

Aspect 13: The method or apparatus of any of aspects 11 through 12, further including operations, features, circuitry, logic, means, or instructions, or any combination thereof for depositing, after removing the first portion of the liner, additional material over the second portion to increase a thickness of the second portion.

Aspect 14: The method or apparatus of any of aspects 11 through 13, further including operations, features, circuitry, logic, means, or instructions, or any combination thereof for removing a section of the second sacrificial layer based at least in part on removing the first portion of the liner, where the first contact surface is exposed based at least in part on removing the section of the second sacrificial layer.

Aspect 15: The method or apparatus of any of aspects 11 through 14, further including operations, features, circuitry, logic, means, or instructions, or any combination thereof for removing, based at least in part on removing the first portion of the liner, a section of a dielectric layer that is below the second sacrificial layer and above the first sacrificial layer, where the first contact surface is exposed based at least in part on removing the section of the second sacrificial layer.

Aspect 16: The method or apparatus of any of aspects 11 through 15, where the set of stacked materials includes a sidewall and, where and removing the second portion of the liner exposes a shelf of the sidewall.

Aspect 17: The method or apparatus of aspects 11 through 16, further including operations, features, circuitry, logic, means, or instructions, or any combination thereof for depositing oxide material within the cavity based at least in part on exposing the second contact surface of the second sacrificial layer, where the first sacrificial layer is replaced with the first metal layer after depositing the oxide material, and where the second sacrificial layer is replaced with the second metal layer after depositing the oxide material.

Aspect 18: The method or apparatus of aspect 17, further including operations, features, circuitry, logic, means, or instructions, or any combination thereof for forming elongated cavities through the oxide material, where the first conductive pillar and the second conductive pillar are each formed within a respective elongated cavity of the elongated cavities.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 19: An apparatus, including: a set of stacked materials including alternating dielectric material and metal material; a first word line contact including a first conductive pillar coupled with a first contact surface of a first word line that includes a first metal layer of the metal material; a second word line contact including a second conductive pillar coupled with a second contact surface of a second word line that includes a second metal layer of the metal material that is above the first metal layer; and a sidewall of the set of stacked materials including a shelf at a same height as the first contact surface of the first word line.

Aspect 20: The apparatus of aspect 19, including: a word line driver coupled with the second word line contact.

Aspect 21: The apparatus of any of aspects 19 through 20, including: an oxide material at least partially surrounding the first conductive pillar and the second conductive pillar.

Aspect 22: The apparatus of aspect 21, where the oxide material separates the second conductive pillar from the sidewall and the shelf.

Aspect 23: The apparatus of any of aspects 19 through 22, including: a dielectric layer between the first metal layer and the second metal layer.

Aspect 24: The apparatus of any of aspects 19 through 23, where the shelf includes a section of the first metal layer.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a set of stacked materials comprising alternating dielectric material and metal material;
a first word line contact comprising a first conductive pillar coupled with a first contact surface of a first word line that comprises a first metal layer of the metal material;
a second word line contact comprising a second conductive pillar coupled with a second contact surface of a second word line that comprises a second metal layer of the metal material that is below the first metal layer;
a first sidewall of the set of stacked materials on a first side of the second conductive pillar and between the first conductive pillar and the second conductive pillar, the first sidewall extending from the second contact surface to the first contact surface;
a second sidewall of the set of stacked materials on a second side of the second conductive pillar opposite the first side and comprising a shelf that is at a same height as the first contact surface of the first word line, the second sidewall extending from the second contact surface and in parallel with the first sidewall; and
a third sidewall of the set of stacked materials on the second side of the second conductive pillar, the third sidewall extending from the shelf and in parallel with the second sidewall.

2. The apparatus of claim 1, comprising:
a word line driver coupled with the second word line contact.

3. The apparatus of claim 1, comprising:
an oxide material at least partially surrounding the first conductive pillar and the second conductive pillar.

4. The apparatus of claim 3, wherein the oxide material separates the second conductive pillar from the second sidewall and the shelf.

5. The apparatus of claim 1, comprising:
a dielectric layer between the first metal layer and the second metal layer.

6. The apparatus of claim 1, wherein the shelf comprises a section of the first metal layer.

* * * * *